United States Patent [19]
Lee et al.

[11] Patent Number: 5,928,816
[45] Date of Patent: Jul. 27, 1999

[54] X-RAY ABSORBER IN X-RAY MASK AND METHOD FOR MANUFACTURING THE SAME

[75] Inventors: Don-Hee Lee; Chil-Keun Park; Ki Chang Song; Young-Sam Jeon; Jeong Soo Lee, all of Kyungki-do, Rep. of Korea

[73] Assignee: LG Semicon Co., Ltd., Chungcheongbuk-Do, Rep. of Korea

[21] Appl. No.: 08/975,253

[22] Filed: Nov. 21, 1997

[30] Foreign Application Priority Data

Nov. 23, 1996 [KR] Rep. of Korea ........................ 96-56874
Apr. 24, 1997 [KR] Rep. of Korea ........................ 97-15438

[51] Int. Cl.⁶ ........................................................ G03F 9/00
[52] U.S. Cl. .................................................. 430/5; 378/35
[58] Field of Search .......................... 430/5, 322; 378/34, 378/35

[56] References Cited

U.S. PATENT DOCUMENTS

5,700,605 12/1997 Ito et al. ...................................... 430/5

*Primary Examiner*—S. Rosasco

[57] ABSTRACT

X-ray absorber in an X-ray mask and a method for manufacturing the same which includes a first layer of crystalline phase formed on a predetermined portion of the surface of a membrane and a second layer of amorphous phase formed on the first layer.

24 Claims, 6 Drawing Sheets

X-RAY ABSORBER IN X-RAY MASK AND METHOD FOR MANUFACTURING THE SAME

BACKGROUND OF THE INVENTION

1. Field of the Invention

The present invention relates to an X-ray mask and, more particularly, to an X-ray absorber in an X-ray mask and a method for manufacturing the same.

2. Discussion of the Related Art

The optical lithography exposure technique, one of the leading techniques used currently in the semiconductor industry, has almost reached its technical and economical limitations. As an alternative to the optical lithography exposure technique, the X-ray lithography technique has recently begun to attract much attention. The development of X-ray masks is one of the most important factors needed for the X-ray lithography process.

Figure 1:
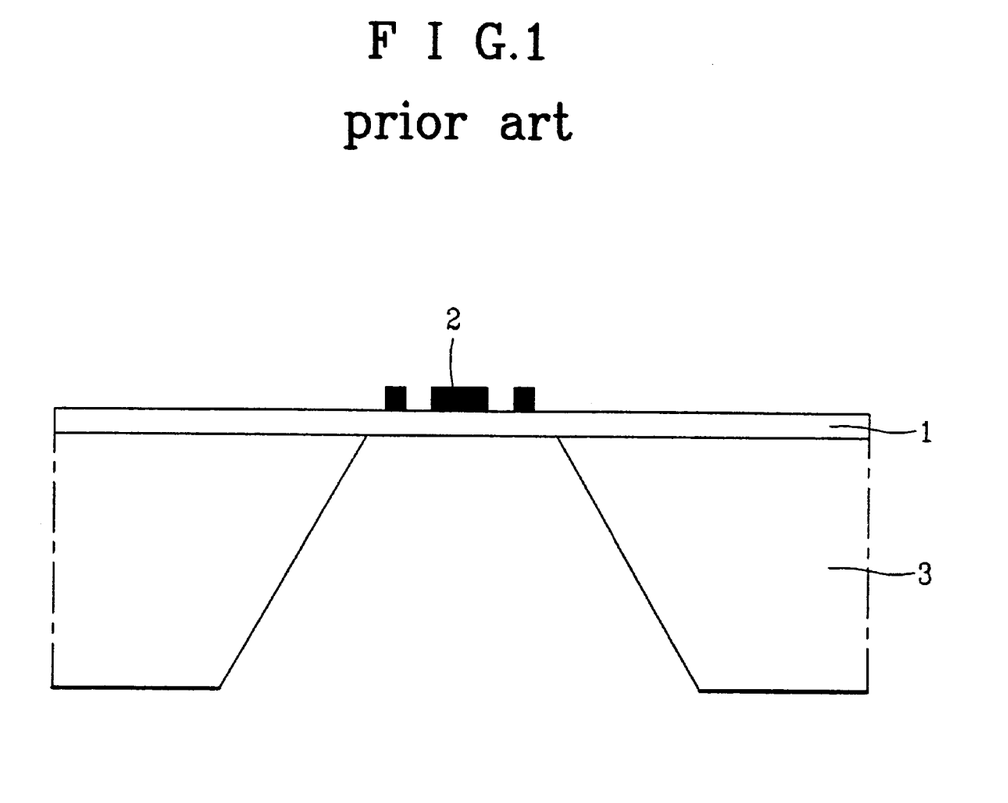
FIG. 1 is a cross-sectional view showing the structure of a general X-ray mask.

A general X-ray mask, as shown in FIG. 1, includes a membrane 1 made of silicon nitride (SiN) or silicon carbide (SiC), an X-ray absorber pattern 2 made of a heavy metal such as tungsten (W) or tantalum (Ta) having a high absorption of X-ray on a predetermined portion of the membrane 1, and a silicon substrate 3 formed under the membrane 1, of which the bottom surface opposite to the X-ray absorber pattern 2 is exposed.

At this time, since the X-ray absorber 2 absorbs X-rays, it has to be stable with regard to X-rays. Moreover, its pattern displacement rarely happens despite heat energy generated by X-ray absorption. The reason why pattern displacement is caused is that the absorption of X-ray causes the X-ray absorber to be distorted. That is to say, the absorption of X-ray changes the residual stress of the X-ray absorber. Accordingly, in order to prevent the generation of this problem, the residual stress which is generated when the X-ray absorber is formed should be reduced.

In one of the methods for reducing residual stress of an X-ray absorber, a 10 nm thick α-W seed layer is formed by evaporation, and then tungsten is sputtered thereon when the temperature of the substrate is 200° C., thus forming an X-ray absorber having low stress.

In another method, tungsten is deposited with a sputtering technique and then a rapid thermal annealing process is carried out over the tungsten, thereby relieving residual stress.

In still another method, tungsten is first deposited. Onto the surface of the X-ray absorber, there is performed an ion implantation process with an inert gas such as neon (Ne), argon (Ar), or Krypton (Kr), thereby relieving residual stress.

In still another method, after tungsten nitride (WN) and tungsten titanium (WTi) in an amorphous phase are deposited thereon, the composite is annealed at a temperature of 300–400° C.

However, conventional methods for manufacturing an X-ray absorber in an X-ray mask having low stress have the following problems.

First, since the annealing process and the ion implantation process are required to adjust the residual stress of an X-ray absorber, the overall manufacturing process becomes complex and an X-ray mask needing a micro dimension pattern is polluted.

Second, since the fine structure of the X-ray absorber is a crystalline phase, the value of its surface roughness becomes about 6–10 nm according to the size of the crystal grains. Accordingly, the micro X-ray absorber pattern has a bad influence on patterning and etching the X-ray absorber.

Third, even though the absorber having an amorphous structure has no grain boundary so that its stress is not changed and the characteristic of the surface roughness is sufficiently excellent to make up for the defects of the absorber having a crystal structure, the difference in stress changes caused by annealing is too small to adjust its residual stress.

SUMMARY OF THE INVENTION

Therefore, the present invention is directed to an X-ray absorber in an X-ray mask and to a manufacturing method thereof which substantially obviates one or more of the problems caused by limitations and disadvantages of related art.

Accordingly, an object of the present invention is to provide an X-ray mask absorber which has a bilayer structure using the deposition method alone for adjusting its residual stress and simplifying the entire process and the manufacturing method thereof.

Another object of the present invention is to provide an X-ray mask absorber wherein the surface is formed of the amorphous phase for improving its surface roughness.

Another object of the present invention is to provide a manufacturing method thereof.

Additional features and advantages of the present invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the X-ray absorber utilized in the X-ray mask of the present invention includes a first layer of crystalline phase formed on a predetermined area of the surface of a membrane and a second layer of amorphous phase formed on the first layer.

In another aspect of the present invention, the X-ray absorber in an X-ray mask includes a first refractory metal layer of crystalline phase formed on a predetermined area of the surface of a membrane and having tensile stress and a second refractory metal layer of an amorphous phase formed on the first refractory metal layer and having compressive stress.

In still another aspect of the present invention, the X-ray absorber in an X-ray mask includes a first refractory metal layer of crystalline phase formed on a predetermined area of the surface of a membrane having compressive stress and a second refractory metal layer of amorphous phase formed on the first refractory metal layer having compressive stress.

In still another aspect of the present invention, a method for manufacturing an X-ray absorber in an X-ray mask includes the steps of depositing tungsten (W) of crystalline phase on a membrane and then depositing tungsten titanium (WTi) or tungsten nitride (WN) of amorphous phase on the tungsten.

In yet another aspect of the present invention, a method for manufacturing an X-ray absorber in an X-ray mask includes the steps of depositing tantalum (Ta) of crystalline phase on a membrane and depositing tantalum boride ($Ta_4B$) on the tantalum.

In a final aspect of the present invention, a method for manufacturing an X-ray absorber in an X-ray mask includes the steps of depositing a first tungsten nitride ($WN_x$) layer of crystalline phase on a membrane, depositing a second tungsten nitride ($WN_x$) layer of amorphous phase on the first tungsten nitride, and annealing the first and second tungsten nitride ($WN_x$) layers.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 2:
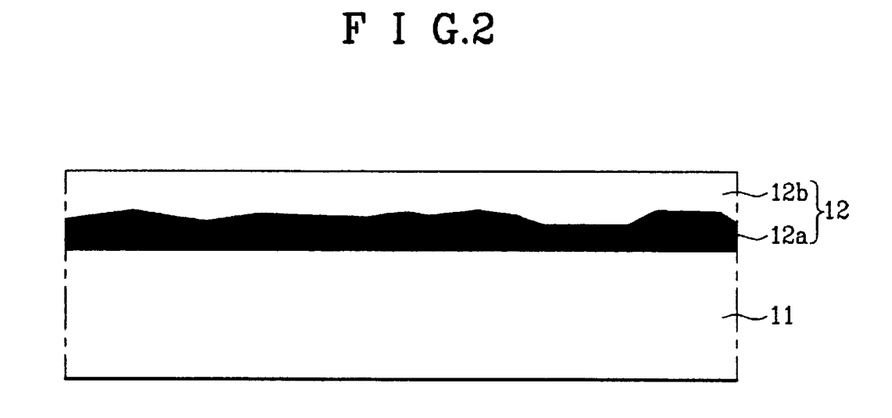
FIG. 2 is a cross-sectional view of an X-ray absorber in an X-ray mask according to the present invention.

Referring to FIG. 2 which is a cross-sectional view of an X-ray absorber in an X-ray mask according to the present invention, the absorber 12 has a bilayer structure composed of a first layer 12a of crystalline phase formed on a membrane 11 and a second layer 12b of amorphous phase formed on the first layer 12a.

Such an absorber having the bilayer structure is classified into two types.

In an absorber of one type, the first layer 12a is made of a refractory metal of crystalline phase with tensile stress and the second layer 12b is made of a refractory metal of amorphous phase with compressive stress. That is to say, it has a bilayer structure composed of one of tungsten titanium (WTi) of amorphous phase/tungsten (W) of crystalline phase, tungsten nitride WN of amorphous phase/tungsten of crystalline phase, and tantalum boride ($Ta_4B$) of amorphous phase/tantalum Ta of crystalline phase.

In an absorber of the other type, a first layer 12a is made of a refractory metal of a crystalline layer with compressive stress and a second layer 12b is made of a refractory metal of amorphous phase with compressive stress. That is to say, it has a bilayer structure composed of, e.g., tungsten nitride WN of amorphous phase/tungsten nitride WN of crystalline phase.

The reasons why an absorber has a bilayer structure will be discussed. First, it is easy to adjust the total stress of an absorber. In the first case discussed previously, the stress of the first layer 12a is opposite to that of the second layer 12b, thus decreasing the total residual stress of the absorber 12. In the second case, since in the first layer 12a, the tungsten nitride of crystalline phase has a big difference of stress changes by annealing, it is easy to adjust the total stress of the absorber.

Second, oxygen diffusion into the absorber 12 can be prevented and its surface roughness becomes superior. In the aforementioned first and second cases, the amorphous phase of the second layer 12b formed on the surface of the absorber 12 prevents oxygen in the air from diffusing into the absorber 12 along the crystal gain boundary so as to remove changes of the residual stress of the absorber 12 which is caused as time goes by and to lower the surface roughness of the absorber 12 to about 1 nm as well.

Embodiments for methods for manufacturing an absorber having the foregoing structure will now be discussed.

First Embodiment of the Invention

First, on a membrane 11 there is deposited tungsten of crystalline phase 12a with a sputtering process using argon gas alone. Next, on the tungsten, there is deposited tungsten nitride of amorphous phase 12b with a reactive sputtering process by adding 10 vol % of nitrogen which is a reactive gas, thereby forming an X-ray absorber with a bilayer structure.

In this case, the deposition pressure for the tungsten is in a range of 3.5–6 mTorr and that for the tungsten nitride is in a range of 1.5–3.5 mTorr.

Figure 3:
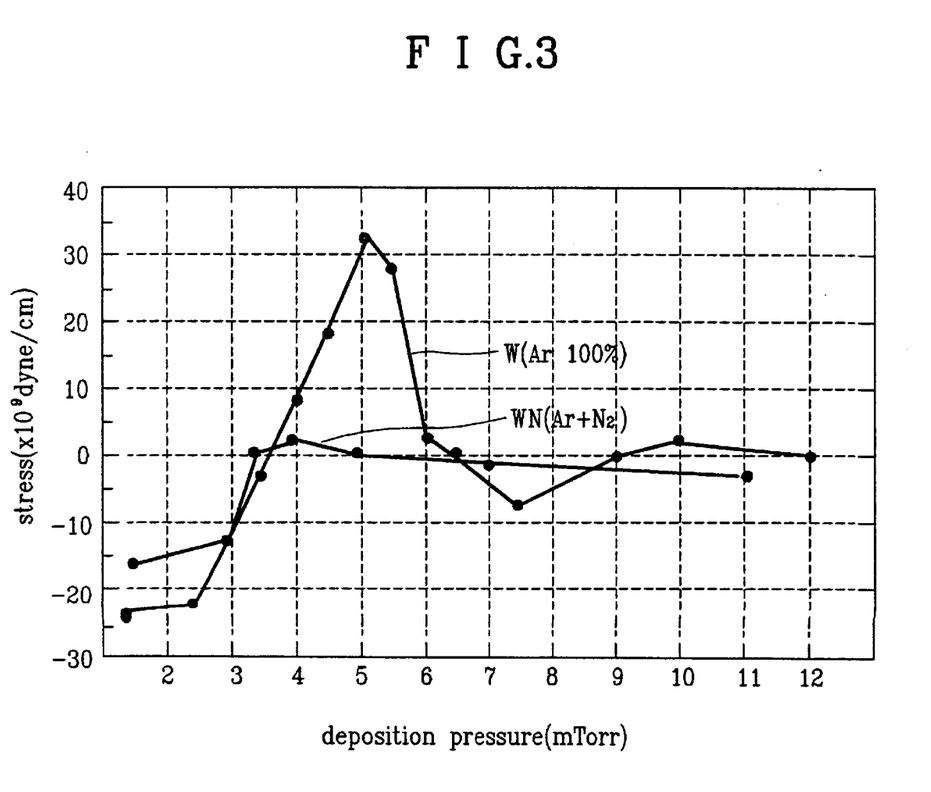
FIG. 3 is a graph showing stress change as a function of the deposition pressure of tungsten and tungsten nitride.

The reason that the deposition pressure is as described above is that tungsten has tensile stress under a deposition pressure of about 3.5–6 mTorr and the tungsten nitride has compressive stress under a deposition pressure of less than about 3.5 mTorr, as shown in FIG. 3 which is a graph showing stress changes according to deposition pressures of tungsten and tungsten nitride.

With regard of a crystal structure, the tungsten has a body centered cubic lattice regardless of its deposition pressure. The tungsten nitride is amorphous when its deposition pressure is less than 3.5 mTorr and the gas ratio of $N_2/(Ar+N_2)$ is less than 0.1 (that is, less than 40 at % of WN contains nitrogen). In contrast, it has a face centered cubic lattice when its deposition pressure is more than 3.5 mTorr and the ratio of $N_2/(Ar+N_2)$ is more than 0.1.

Figure 4:
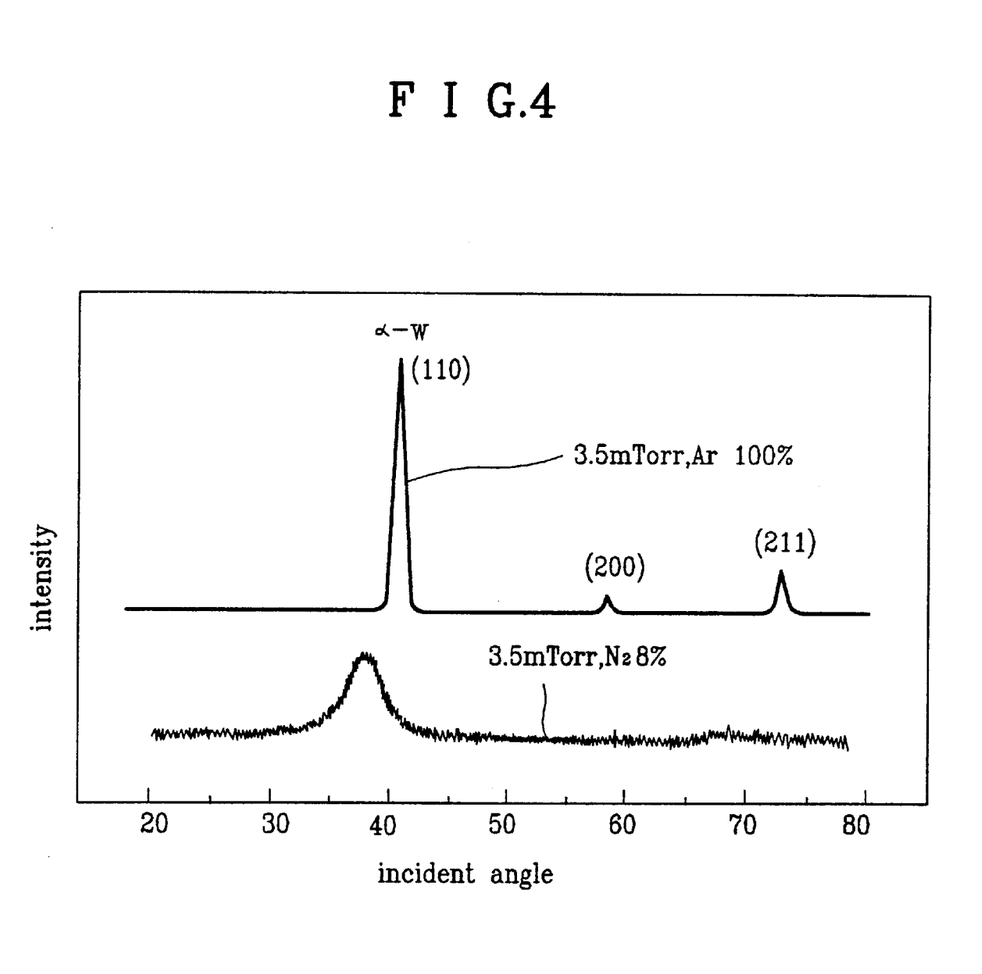
FIG. 4 is a graph showing analysis of X-ray diffraction for determining the crystalline structure of the materials.

As shown in FIG. 4, which is a graph showing an X-ray diffraction analysis, the above-described structures can clearly be noted. If X-ray is incident to the atomic structure of the tungsten at a predetermined angle, the line of intensity of the X-ray has a peak due to the crystalline phase of the tungsten. If it is incident to that of the tungsten nitride by a predetermined angle, the line of intensity of the X-ray is very smooth due to the amorphous phase of the tungsten nitride.

The X-ray absorber has a bilayer structure of tungsten of crystalline phase having tensile stress and tungsten nitride of the amorphous phase having compressive stress, so that the residual stress of the X-ray absorber becomes low tensile stress due to their opposite stresses. In addition, its surface roughness is less than 1 nm. In comparison with the surface roughness (6–10 nm) of a conventional X-ray absorber, the surface roughness of the X-ray absorber of the present invention is significantly improved.

Moreover, when the tungsten and the tungsten nitride are deposited by predetermined deposition pressures, their thicknesses are adjusted due to the stress of tungsten nitride, thereby dropping its residual stress to less than $1 \times 10^9$ dyne/cm$^2$. For example, if the crystalline tungsten is deposited under a pressure of 4 mTorr and the amorphous tungsten nitride in which the amount of nitrogen is 30% is deposited under a pressure of 3 mTorr, and the thickness ratio of the crystalline to the amorphous form is 2:1, there is formed an X-ray absorber having low tensile stress of $8 \times 10^8$ dyne/cm$^2$.

Second Embodiment of the Invention

After tungsten of crystalline phase 12a is deposited on a membrane 11 with a sputtering process using argon gas alone, tungsten titanium (WTi) of amorphous phase 12b in which the titanium (Ti) is present in an amount of less than 5 wt % is deposited, thereby forming an X-ray absorber 12 having double layers.

At this time, the deposition pressure of the tungsten is in a range of 3.5–6 mTorr and the deposition pressure of the tungsten titanium is in a range of 1.5–3.5 mTorr. The thickness ratio of the tungsten and the tungsten titanium (WTi) is adjusted so that the residual stress of the X-ray absorber is low tensile stress.

Third Embodiment of the Invention

On a membrane 11, there is sputtered tantalum of crystalline phase 12a having a tensile stress under more than 3.5 mTorr. Next, on the tantalum, there is deposited tantalum boride of amorphous phase 12b under less than 3.5 mTorr, thereby forming an X-ray absorber 12 having a low tensile stress of less than $9 \times 10^8$ dyne/cm$^2$.

At this time, the residual stress and the crystal structure of the tantalum are similar to that of tungsten, and the tantalum boride is amorphous as well as having a compressive stress under less than 4 mTorr, like tungsten nitride, when the ratio of tantalum and boron is 4:1. The stress of the X-ray absorber is adjusted by the thickness ratio of the amorphous tantalum boride Ta$_4$B and the tantalum.

Fourth Embodiment of the Invention

According to a fourth embodiment, tungsten target is used as the material for an absorber. A reactive sputtering process using a gas mixture of argon Ar and nitrogen N$_2$ is used to manufacture a tungsten nitride (WN$_x$) absorber having a bilayer structure.

First, using a sputtering gas having a gas ratio of N$_2$/(Ar+N$_2$) of more than 0.1, under a deposition pressure of 3.5 mTorr, tungsten nitride of crystalline phase is deposited on a membrane. Subsequently, using a 0.05 gas ratio of N$_2$/(Ar+N$_2$) under a deposition pressure of 3.5 mTorr, tungsten nitride of amorphous phase is deposited on the tungsten nitride of crystalline phase, thereby manufacturing an absorber. In other words, the absorber has a bilayer structure composed of tungsten nitride of amorphous phase/tungsten nitride of crystalline phase. In this case, the reason that the deposition pressures for both tungsten nitride of different phases is the same will be discussed. If the ratio of nitrogen contained in the sputtering gas mixture is less than 10 vol %, the tungsten nitride has an amorphous phase. If the ratio of nitrogen contained is more than 10 vol %, the tungsten nitride has of a crystalline phase.

Figure 5:
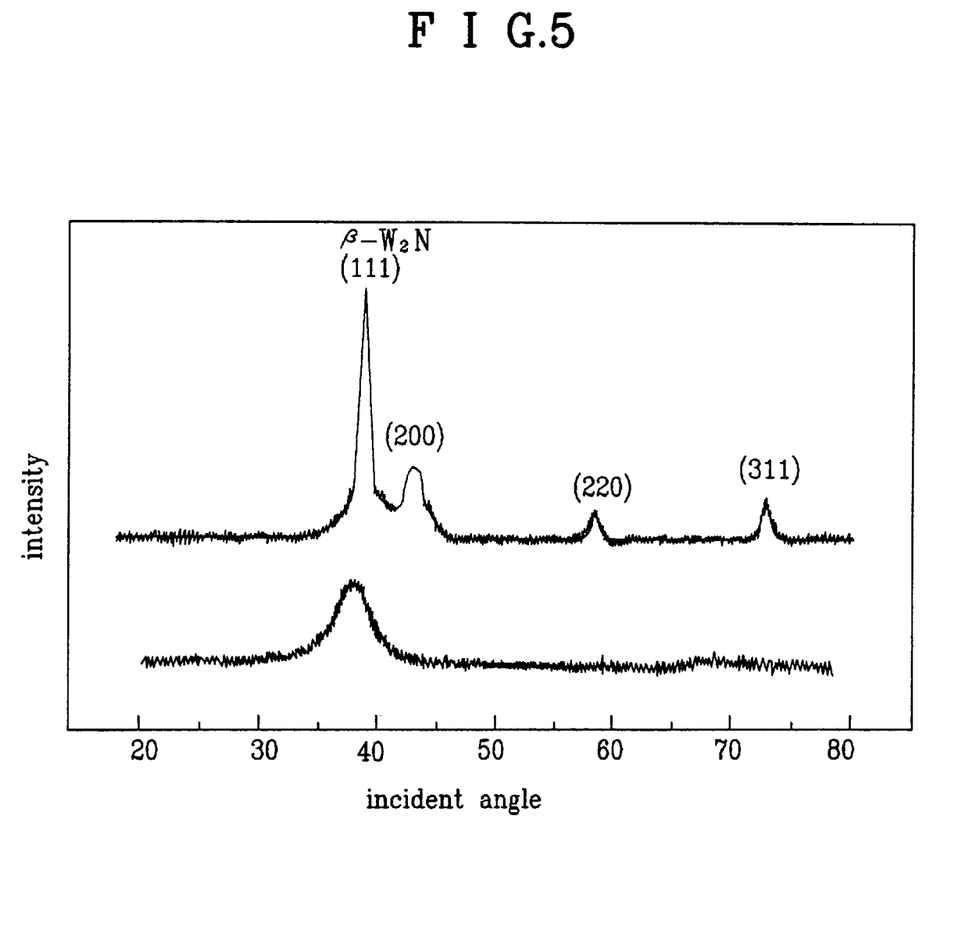
FIG. 5 is a graph showing an analysis of X-ray diffraction of a tungsten nitride absorber according to a fourth embodiment of the present invention.

FIG. 5 is a graph showing an analysis of the X-ray diffraction of the tungsten nitride absorber according to the fourth embodiment of the present invention. As shown in FIG. 5, if the X-ray is incident onto the atomic structure of the tungsten nitride by a predetermined angle, the tungsten nitride of crystalline phase having more than 10 vol % ratio of nitrogen contained in the gas mixture has a keen peak in the line of X-ray intensity because it is of the crystalline phase ($\beta$-W$_2$N), and the tungsten nitride of amorphous phase having less than 10 vol % of nitrogen has a smooth curve in the line of X-ray intensity.

The absorber manufactured in this way is annealed at a temperature higher than about 200° C. so as to have a low stress of within ±10 MPa.

Figure 6:
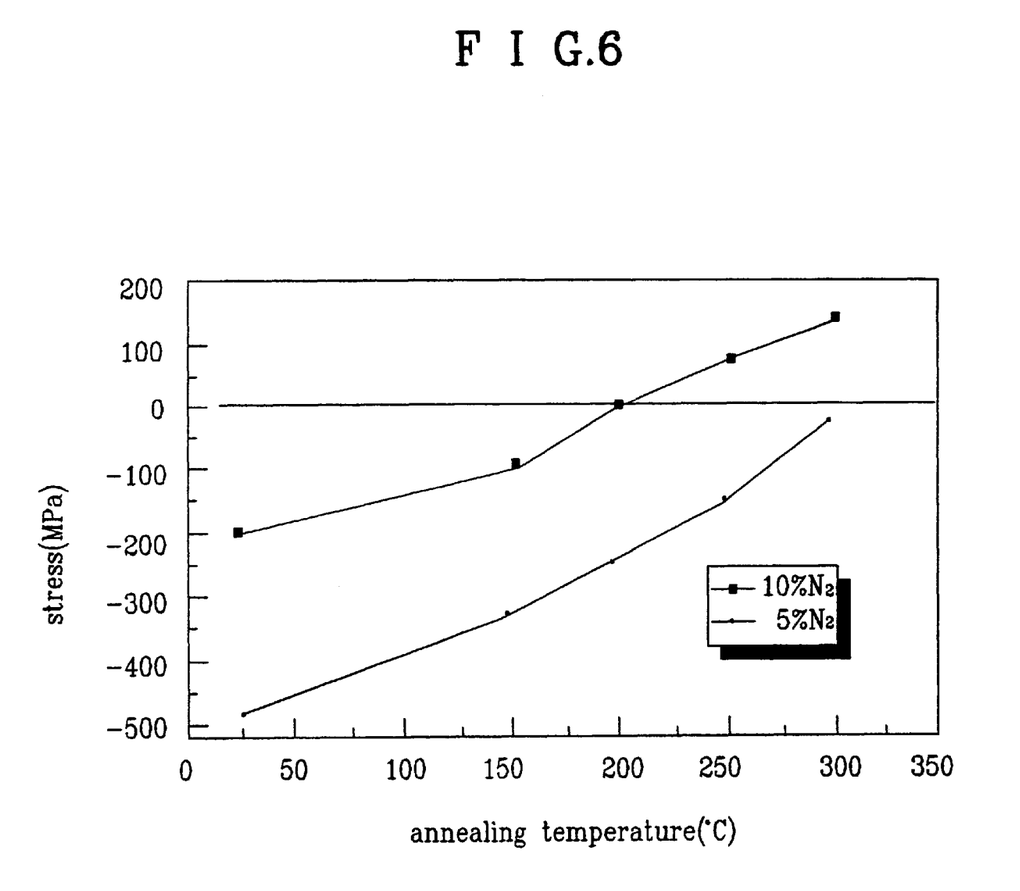
FIG. 6 is a graph showing the stress change by annealing the tungsten nitride absorber according to the fourth embodiment of the present invention.

The reason for adjusting the stress of the absorber by adjusting the annealing temperature according to the fourth embodiment will be discussed. FIG. 6 is a graph showing stress changes by annealing the tungsten nitride absorber according to the fourth embodiment. A tungsten nitride thin film of amorphous phase deposited by using a sputtering gas mixture in which the amount of the nitrogen is 5 vol % has a density of 17 g/cm$^3$. However, the early stress is −400 MPa which is pretty high and it is difficult to adjust the film to have a low stress by annealing. The tungsten nitride thin film of crystalline phase deposited by using a sputtering gas mixture in which the amount of nitrogen is 10 vol % has a density of 15 g/cm$^3$ which is lower than that of the tungsten nitride of the amorphous phase. However, its early stress is −250 MPa which is pretty low and the difference of stress changes is big enough to adjust the absorber to have a low stress by annealing. Yet, oxygen is diffused due to the presence of a crystalline grain boundary, thereby changing the residual stress of the thin film.

According to the fourth embodiment, the advantage of using tungsten nitride in the crystalline phase is that it is easy to adjust the stress by annealing and the advantage of using tungsten nitride in the amorphous phase having a high density, higher than 15 g/cm$^3$ is to prevent oxygen diffusion into the absorber and obtain a smooth surface of the absorber and good absorption of X-ray. Also, the annealing temperature for good early stress and low stress of the absorber can be adjusted by varying the thickness ratio of the tungsten nitrides of the amorphous and crystalline phases.

Figure 7:
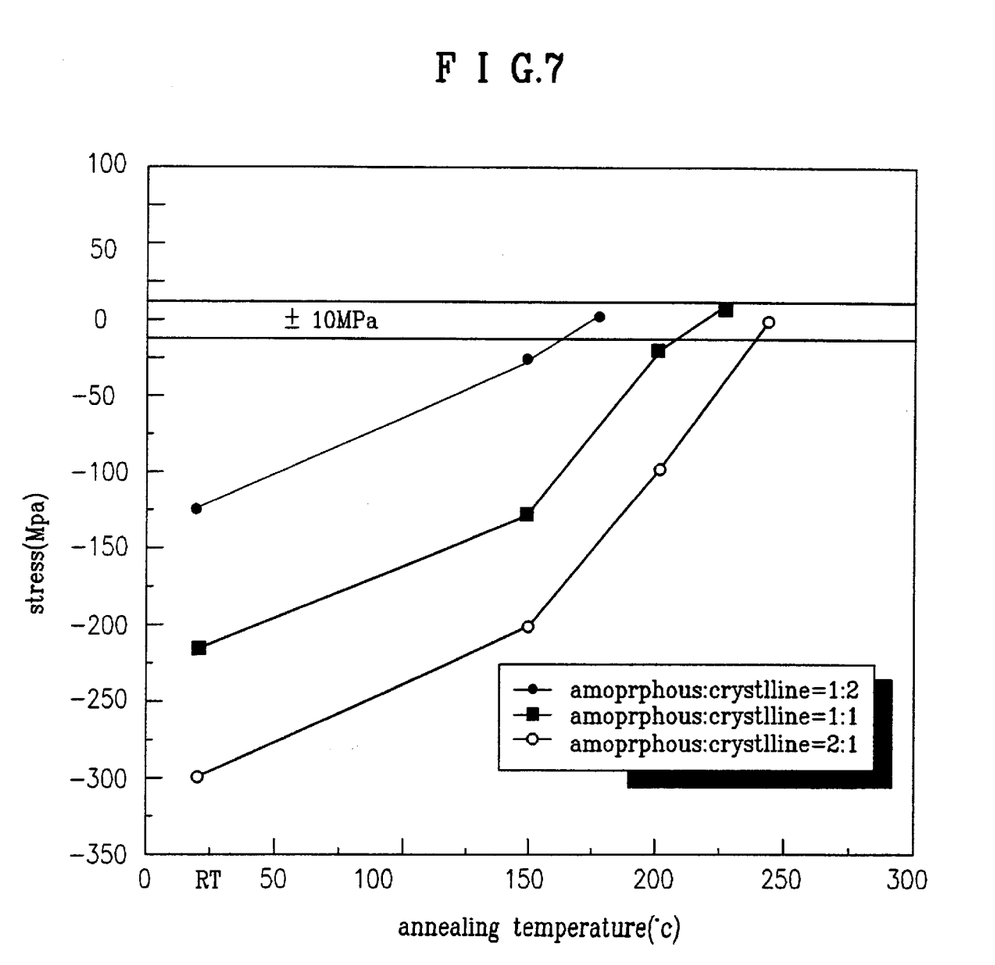
FIG. 7 is a graph showing the stress change by annealing the bilayer absorber.

FIG. 7 is a graph showing stress changes by annealing the bilayer absorber. Bilayer absorbers having the thickness ratios (amorphous:crystalline) of 1:2, 1:1, and 2:1 are annealed at an appropriate temperature to have low stress.

The X-ray absorber in an X-ray mask and the method for manufacturing the same have the following advantages. First, since it is easy to adjust its stress by an annealing process, X-ray masks having an absorber with low stress can be manufactured. Second, since the differences in stress changes is reduced by preventing oxygen from diffusing into an X-ray absorber, X-ray masks having an absorber with high stability can be manufactured. Third, since the surface roughness of the absorber is excellent, this feature is advantageous in forming fine patterns of the absorber utilizing an etching process. Fourth, an absorber of high density and having a good absorbing ability of X-ray can be produced. Finally since an absorber has a bilayer structure having both tensile stress and compressive stress, the adjustment for stress is facilitated and its overall process is simplified.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An X-ray absorber in an X-ray mask having a membrane, comprising:
    a first layer of crystalline phase formed on a predetermined area of a surface of the membrane; and
    a second layer of amorphous phase formed on the first layer.

2. The X-ray absorber as claimed in claim 1, wherein said first layer is selected from the group consisting of tungsten, tantalum, and tungsten nitride.

3. The X-ray absorber as claimed in claim 1, wherein said second layer is selected from the group consisting of tungsten nitride, tungsten titanium, and tantalum boride (Ta$_4$B).

4. An X-ray absorber in an X-ray mask having a membrane, comprising:
   a first refractory metal layer of crystalline phase formed on a predetermined area of a surface of the membrane and having tensile stress; and
   a second refractory metal layer of amorphous phase formed on said first refractory metal layer and having compressive stress.

5. The X-ray absorber as claimed in claim 4, wherein said first refractory metal layer is selected from the group consisting of tungsten and tantalum.

6. The X-ray absorber as claimed in claim 4, wherein said second refractory metal layer is selected from the group consisting of tungsten nitride, tungsten titanium, and tantalum boride $Ta_4B$.

7. An X-ray absorber in an X-ray mask having a membrane, comprising:
   a first refractory metal layer of crystalline phase formed on a predetermined area of a surface of the membrane and having compressive stress; and
   a second refractory metal layer of amorphous phase formed on said first refractory metal layer and having compressive stress.

8. The X-ray absorber as claimed in claim 7, wherein said first and second refractory metal layers are made of tungsten nitride.

9. A method for manufacturing an X-ray absorber in an X-ray mask having a membrane, comprising the steps of:
   depositing tungsten of crystalline phase on the membrane; and
   depositing either tungsten nitride or tungsten titanium of amorphous phase on the tungsten.

10. The method as claimed in claim 9, wherein the tungsten is deposited under a pressure of 3.5–6 mTorr and the tungsten nitride or the tungsten titanium is deposited under a pressure of 1.5–3.5 mTorr.

11. The method as claimed in claim 9, wherein the amount of nitrogen contained in the tungsten nitride is less than 40 at % and the amount of titanium contained in the tungsten titanium is less than 5 wt %.

12. The method as claimed in claim 9, wherein a stress in the X-ray absorber is adjusted by adjusting the thickness ratio of the tungsten and the tungsten nitride, or the thickness ratio of the tungsten and the tungsten titanium.

13. A method for manufacturing an X-ray absorber in an X-ray mask having a substrate and a membrane, comprising the steps of:
   depositing tantalum of crystalline phase on the membrane; and
   depositing tantalum boride ($Ta_4B$) of amorphous phase on the tantalum.

14. The method as claimed in claim 13, wherein the tantalum is deposited under a pressure of more than 3.5 mTorr and the tantalum boride is deposited under a pressure of less than 3.5 mTorr.

15. The method as claimed in claim 13, wherein a stress in the X-ray absorber is adjusted by adjusting the thickness ratio of the tantalum and the tantalum boride.

16. A method for manufacturing an X-ray absorber in an X-ray mask having a membrane, comprising the steps of:
   depositing a first tungsten nitride ($WN_x$) layer of crystalline phase on the membrane;
   depositing a second tungsten nitride of amorphous phase on the first tungsten nitride; and
   annealing the first and second tungsten nitride ($WN_x$) layers.

17. The method as claimed in claim 16, wherein the first and second tungsten nitride ($WN_x$) layers are deposited under a pressure of 1–5 mTorr.

18. The method as claimed in claim 16, wherein the first and second tungsten nitride ($WN_x$) layers are deposited in a gas ratio of 0.03–0.15 of $N_2/(Ar+N_2)$.

19. The method as claimed in claim 16, wherein a stress in the first and second tungsten nitride ($WN_x$) layers is adjusted by adjusting an annealing temperature.

20. The method as claimed in claim 16, wherein the annealing temperature is higher than 200° C.

21. The method as claimed in claim 16, wherein the annealing temperature is adjusted by adjusting the thickness ratio of the first and second tungsten nitride ($WN_x$) layers.

22. An X-ray mask containing an X-ray absorber having a membrane, comprising:
   a first layer of crystalline phase formed on a predetermined area of a surface of the membrane; and
   a second layer of amorphous phase formed on the first layer.

23. An X-ray mask containing an X-ray absorber having a membrane, comprising:
   a first refractory metal layer of crystalline phase formed on a predetermined area of a surface of the membrane and having tensile stress; and
   a second refractory metal layer of amorphous phase formed on the first refractory metal layer and having compressive stress.

24. An X-ray mask containing an X-ray absorber having a membrane, comprising:
   a first refractory metal layer of crystalline phase formed on a predetermined area of a surface of the membrane to have compressive stress; and
   a second refractory metal layer of amorphous phase formed on the first refractory metal layer and having compressive stress.

* * * * *